US011267989B2

(12) United States Patent
Kamimura

(10) Patent No.: US 11,267,989 B2
(45) Date of Patent: Mar. 8, 2022

(54) POLISHING LIQUID AND CHEMICAL MECHANICAL POLISHING METHOD

(71) Applicant: FUJIFILM CORPORATION, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/984,270

(22) Filed: Aug. 4, 2020

(65) Prior Publication Data

US 2020/0362199 A1 Nov. 19, 2020

Related U.S. Application Data

(63) Continuation of application No. PCT/JP2019/008080, filed on Mar. 1, 2019.

(30) Foreign Application Priority Data

Mar. 23, 2018 (JP) ............................ JP2018-057175

(51) Int. Cl.

| | |
|---|---|
| ***C09G 1/02*** | (2006.01) |
| ***C08K 3/36*** | (2006.01) |
| ***C08K 5/09*** | (2006.01) |
| ***C08K 5/3442*** | (2006.01) |
| ***C08K 5/3467*** | (2006.01) |
| ***C08K 5/41*** | (2006.01) |
| ***C08K 5/51*** | (2006.01) |
| ***C09K 3/14*** | (2006.01) |
| ***H01L 21/306*** | (2006.01) |

(52) U.S. Cl.

CPC .................. *C09G 1/02* (2013.01); *C08K 3/36* (2013.01); *C08K 5/09* (2013.01); *C08K 5/3442* (2013.01); *C08K 5/3467* (2013.01); *C08K 5/41* (2013.01); *C08K 5/51* (2013.01); *C09K 3/1463* (2013.01); *H01L 21/30625* (2013.01)

(58) Field of Classification Search

None

See application file for complete search history.

(56) References Cited

U.S. PATENT DOCUMENTS

| | | | |
|---|---|---|---|
| 2007/0298612 | A1 | 12/2007 | Dysard et al. |
| 2010/0099260 | A1 | 4/2010 | Matsumoto et al. |
| 2012/0028467 | A1 | 2/2012 | Kamimura |
| 2013/0005219 | A1 | 1/2013 | Takemura et al. |
| 2013/0146804 | A1 | 6/2013 | Mizuno et al. |
| 2015/0284593 | A1 | 10/2015 | Wang et al. |
| 2019/0112505 | A1 | 4/2019 | Yoshizaki et al. |

FOREIGN PATENT DOCUMENTS

| | | | |
|---|---|---|---|
| JP | 2009-540575 | A | 11/2009 |
| JP | 2012-033647 | A | 2/2012 |
| JP | 2012-040671 | A | 3/2012 |
| JP | 2015-174953 | A | 10/2015 |
| JP | 2015-201644 | A | 11/2015 |
| JP | 2016-069465 | A | 5/2016 |
| JP | 2017-149798 | A | 8/2017 |
| WO | 2008/117592 | A1 | 10/2008 |
| WO | 2011/093153 | A1 | 8/2011 |
| WO | 2017/169808 | A1 | 10/2017 |

OTHER PUBLICATIONS

International Search Report dated May 14, 2019, issued by the International Searching Authority in application No. PCT/JP2019/008080.

Written Opinion dated May 14, 2019, issued by the International Searching Authority in application No. PCT/JP2019/008080.

International Preliminary Report on Patentability dated Sep. 29, 2020, issued by the International Bureau in application No. PCT/JP2019/008080.

Communication dated May 25, 2021, from the Japanese Patent Office in application No. 2020-508127.

*Primary Examiner* — Roberts P Culbert

(74) *Attorney, Agent, or Firm* — Sughrue Mion, PLLC

(57) ABSTRACT

A polishing liquid used for chemical mechanical polishing includes colloidal silica, in which a zeta potential of the colloidal silica measured in a state where the colloidal silica is present in the polishing liquid is −20 mV or less, an electrical conductivity is 200 μS/cm or less, a pH is 2 to 6, and a transmittance is 70% to 99%.

20 Claims, No Drawings

POLISHING LIQUID AND CHEMICAL MECHANICAL POLISHING METHOD

CROSS-REFERENCE TO RELATED APPLICATIONS

This application is a Continuation of PCT International Application No. PCT/JP2019/008080 filed on Mar. 1, 2019, which claims priority under 35 U.S.C § 119(a) to Japanese Patent Application No. 2018-057175 filed on Mar. 23, 2018. Each of the above application(s) is hereby expressly incorporated by reference, in its entirety, into the present application.

BACKGROUND OF THE INVENTION

1. Field of the Invention

The present invention relates to a polishing liquid and a chemical mechanical polishing method.

2. Description of the Related Art

In manufacturing a semiconductor integrated circuit (large-scale integrated circuit: LSI), a chemical mechanical polishing (CMP) method is used for flattening a bare wafer, flattening an interlayer insulating film, forming a metal plug, forming an embedded wiring, and the like.

Among processes of such LSI manufacturing, use of CMP is expected to increase in Front End of Line (FEOL), which is a pre-process of manufacturing semiconductor integrated circuits. In FEOL, materials forming a film that is a target of CMP are mainly silicon nitride, silicon oxide, and polysilicon. Performing polishing at which a selection ratio of these materials has various requirements depending on usage applications.

For example, JP2009-540575A discloses use of "a polishing composition including (a) 0.01% to 15% by mass of colloidal silica, (b) 10/1,000,000 to 100,000 parts (ppm)/1,000,000 of at least one acidic component having a pKa within a range of 1 to 4.5, and (c) an aqueous carrier therefor" in order to increase a polishing speed for silicon nitride.

SUMMARY OF THE INVENTION

The inventors of the present invention have found that, in a case of using the polishing liquid including colloidal silica as disclosed in JP2009-540575A, there may be a case in which a ratio of a polishing speed for silicon nitride to a polishing speed for silicon oxide is small, and therefore silicon nitride cannot be selectively polished with respect to silicon oxide. In addition, they have also found that many defects (particularly, polishing scratches called scratches) may be generated on a polishing target surface of a polishing target object after polishing.

An object of the present invention is to provide a polishing liquid in which, in a case where the polishing liquid is applied to CMP, selectivity of polishing of silicon nitride with respect to silicon oxide is high, and defects are less likely to be generated on a polishing target surface; and a chemical mechanical polishing method.

The inventors of the present invention have made intensive studies on the above-mentioned object, and as a result, they have found that selectivity of polishing of silicon nitride with respect to silicon oxide is high, and defects are less likely to be generated on a polishing target surface by using a polishing liquid including colloidal silica, in which a zeta potential of the colloidal silica measured in a state where the colloidal silica is present in the polishing liquid is −20 mV or less, an electrical conductivity is 200 μS/cm or less, a pH is 2 to 6, and a transmittance is 70% to 99%. Thereby, the present invention has been completed.

That is, the inventors of the present invention have found that the above-mentioned object can be achieved by the following configuration.

[1] A polishing liquid used for chemical mechanical polishing, the polishing liquid comprising: colloidal silica, in which a zeta potential of the colloidal silica measured in a state where the colloidal silica is present in the polishing liquid is −20 mV or less, an electrical conductivity is 200 μS/cm or less, a pH is 2 to 6, and a transmittance is 70% to 99%.

[2] The polishing liquid according to [1], in which an average aspect ratio of the colloidal silica is 1.5 to 2.0.

[3] The polishing liquid according to [1] or [2], in which a diffusion electrical double layer is formed on a surface of the colloidal silica, the diffusion electrical double layer has a fixing layer formed on the surface side of the colloidal silica, and a diffusion layer formed outside the fixing layer, and a thickness of the diffusion layer is 10 to 1,000 Å.

[4] The polishing liquid according to any one of [1] to [3], in which, in a case where a pH of the polishing liquid is denoted by X, and a zeta potential of the colloidal silica measured in a state where the colloidal silica is present in the polishing liquid is denoted by Y, a zeta potential in a case where a pH of the polishing liquid is set to X+1, and a zeta potential in a case where a pH of the polishing liquid is set to X−1 are both within a range of Y±5 mV.

[5] The polishing liquid according to any one of [1] to [4], in which an average primary particle size of the colloidal silica is 15 nm or less.

[6] The polishing liquid according to any one of [1] to [5], in which the electrical conductivity is 0.05 to 200 μS/cm.

[7] The polishing liquid according to any one of [1] to [6], in which the colloidal silica has, on a surface thereof, at least one group selected from the group consisting of a sulfonic acid group, a phosphonic acid group, and a carboxylic acid group.

[8] The polishing liquid according to any one of [1] to [7], further comprising: an acid component, in which the acid component is at least one compound selected from the group consisting of a compound having an acid group and a basic group, and phosphoric acid.

[9] The polishing liquid according to [8], in which the compound having an acid group and a basic group has a cyclic structure.

[10] The polishing liquid according to any one of [1] to [9], further comprising a compound having a heterocyclic ring having two or more nitrogen atoms.

[11] The polishing liquid according to any one of [1] to [10], in which, in a case where the polishing liquid is used for polishing silicon nitride and silicon oxide, a ratio of a polishing speed for the silicon nitride to a polishing speed for the silicon oxide is 10 or more.

[12] The polishing liquid according to any one of [1] to [11], further comprising a cationic surfactant or an amphoteric surfactant.

[13] The polishing liquid according to [12], in which, in a case where the polishing liquid is used for polishing silicon nitride and polysilicon, a ratio of a polishing speed for the silicon nitride to a polishing speed for the polysilicon is 0.25 to 4.

[14] The polishing liquid according to any one of [1] to [11], further comprising an anionic surfactant.

[15] The polishing liquid according to [14], in which, in a case where the polishing liquid is used for polishing silicon nitride and polysilicon, a ratio of a polishing speed for the silicon nitride to a polishing speed for the polysilicon is 4 to 100.

[16] A chemical mechanical polishing method comprising a step of bringing a polishing target surface of a polishing target object into contact with a polishing pad while supplying the polishing liquid according to any one of [1] to [15] to the polishing pad attached to a polishing platen, relatively moving the polishing target object and the polishing pad to polish the polishing target surface, and obtaining a polished polishing target object.

[17] The chemical mechanical polishing method according to [16], in which the polishing target object contains silicon nitride and silicon oxide.

[18] The chemical mechanical polishing method according to [17], in which the polishing target object further contains polysilicon.

As will be described hereinafter, according to the present invention, it is possible to provide a polishing liquid in which, in a case where the polishing liquid is applied to CMP, selectivity of polishing of silicon nitride with respect to silicon oxide is high, and defects are less likely to be generated on a polishing target surface; and a chemical mechanical polishing method.

DESCRIPTION OF THE PREFERRED EMBODIMENTS

Hereinafter, the present invention will be described in detail.

The description of constituent elements described below can be made based on representative embodiments of the present invention, but the present invention is not limited to such embodiments.

Numerical value ranges expressed using "to" in the present specification mean a range including numerical values described before and after "to" as the lower limit value and the upper limit value.

Furthermore, in the present specification, the term "ppm" means "parts-per-million ($10^{-6}$)."

Furthermore, in the present specification, 1 Å (angstrom) corresponds to 0.1 nm.

[Polishing Liquid]

A polishing liquid of the embodiment of the present invention (hereinafter, also referred to as a "present polishing liquid") is a polishing liquid which is used for chemical mechanical polishing and includes colloidal silica, in which a zeta potential of the colloidal silica measured in a state where the colloidal silica is present in the polishing liquid is −20 mV or less, an electrical conductivity is 200 μS/cm or less, a pH is 2 to 6, and a transmittance is 70% to 99%.

Regarding the present polishing liquid, selectivity of polishing of silicon nitride (hereinafter, also referred to as "SiN") with respect to silicon oxide (hereinafter, also referred to as "$SiO_2$") is high. Although some parts of details of a reason thereof have not yet been clarified, the reason is presumed as follows.

Polishing of SiN easily proceeds in a case where a surface potential of SiN is positive. There is a method of making a pH of the polishing liquid acidic (specifically, a pH of 2 to 6) to make a surface potential of SiN positive. In other words, in a case where a pH of the polishing liquid is acidic, a surface potential of SiN is positive. In addition, a surface potential of $SiO_2$ tends to be located on a negative side with respect to a surface potential of SiN.

For this reason, in a case where a zeta potential of colloidal silica is negative (specifically, −20 mV or less), it is presumed that, due to the electrical relationship, the colloidal silica and $SiO_2$ repel each other and the colloidal silica and SiN easily come into contact with each other. It is presumed that, accordingly, polishing of SiN proceeds preferentially.

Furthermore, it is considered that use of a polishing liquid having a low electrical conductivity controls the action between $SiO_2$ and colloidal silica, and thereby a polishing speed for $SiO_2$ is reduced.

As described above, it is considered that an effect exhibited by using colloidal silica having a low zeta potential and an effect exhibited by using a polishing liquid having a low electrical conductivity act synergistically, thereby improving selectivity of polishing SiN with respect to $SiO_2$.

After polishing with the present polishing liquid, defects (particularly scratches) are less likely to be generated on a polishing target surface of a polishing target object. Although some parts of details of a reason thereof have not yet been clarified, the reason is presumed as follows.

It is considered that, in a case where the number of aggregated particles in the polishing liquid increases due to aggregation of colloidal silica, a polishing target surface is easily scratched due to coarse aggregated particles. The present polishing liquid has a low electrical conductivity as described above. In a case where the electrical conductivity of the polishing liquid is low, aggregation of colloidal silica tends to be inhibited. It is considered that, for this reason, generation of defects on the polishing target surface can be inhibited.

In addition, the present polishing liquid has a high transmittance (specifically, a transmittance of 70% to 99%). Due to the high transmittance of the polishing liquid, generation of defects on the polishing target surface can be inhibited. Because it can be said that the polishing liquid having a high transmittance is in a state in which the number of aggregated particles is small, it is considered that generation of defects on the polishing target surface can be inhibited.

Components contained in the present polishing liquid and components that may be contained therein will be described below.

<Colloidal Silica>

The present polishing liquid includes colloidal silica (silica colloidal particles). The colloidal silica functions as abrasive grains for polishing a polishing target object.

An average primary particle size of the colloidal silica is preferably 15 nm or less and is more preferably 12 nm or less from the viewpoint of further inhibiting generation of defects on a polishing target surface.

The lower limit value of an average primary particle size of the colloidal silica is preferably 1 nm or more, and more preferably 3 nm or more from the viewpoint that then, aggregation of the colloidal silica is inhibited and temporal stability of the present polishing liquid is improved.

An average primary particle size is obtained by measuring particle sizes (equivalent circle diameters) of 1000 primary particles arbitrarily selected from an image captured using a transmission electron microscope TEM2010 (pressurization voltage: 200 kV) manufactured by JEOL Ltd., and arithmetically averaging the values. The equivalent circle diameter is a diameter of a circle assuming a true circle having the same projected area as a projected area of a particle in a case of observation.

However, in a case where a commercially available product is used as colloidal silica, a catalog value is preferentially adopted as an average primary particle size of the colloidal silica.

An average aspect ratio of the colloidal silica is preferably 1.5 to 2.0, more preferably 1.55 to 1.95, and particularly preferably 1.6 to 1.9, from the viewpoint of improving polishing power.

The average aspect ratio of the colloidal silica is obtained by measuring a major axis and a minor axis for every arbitrary 100 particles observed with the above-mentioned transmission electron microscope, calculating aspect ratios (major axis/minor axis) of the respective particles, and arithmetically averaging the aspect ratios of the 100 particles. The major axis of a particle means a length of the particle in a major axis direction, and the minor axis of a particle means a length of the particles in a direction orthogonal to the major axis direction of the particle.

However, in a case where a commercially available product is used as colloidal silica, a catalog value is preferentially adopted as an average aspect ratio of the colloidal silica.

A degree of association of the colloidal silica is preferably 1 to 3 and is more preferably 1.5 to 2.5 from the viewpoint of further increasing the polishing speed.

In the present specification, the degree of association is obtained by the equation: degree of association=average secondary particle size/average primary particle size. The average secondary particle size corresponds to an average particle size (equivalent circle diameter) of secondary particles in an aggregated state, and can be obtained by the same method as in the average primary particle size.

However, in a case where a commercially available product is used as colloidal silica, a catalog value is preferentially adopted as a degree of association of the colloidal silica.

The colloidal silica preferably has, on a surface thereof, at least one group (hereinafter, also referred to as a "surface-modifying group") selected from the group consisting of a sulfonic acid group, a phosphonic acid group, and a carboxylic acid group. As a result, a zeta potential of the colloidal silica can be further lowered, and thereby selectivity of polishing SiN with respect to $SiO_2$ is further improved.

Among the surface-modifying groups, a sulfonic acid group is preferable because it is easily negatively charged (in other words, it has strong acidity and is easily deprotonated).

The group may be ionized in the polishing liquid.

A method for obtaining colloidal silica having a surface-modifying group is not particularly limited, and examples thereof include a method disclosed in JP2010-269985A.

As the colloidal silica, commercially available products may be used, and examples thereof include colloidal silica having the above-mentioned surface-modifying group such as PL1D, PL07D, PL2D, and PL3D (all of which are product names, manufactured by FUSO CHEMICAL CO., LTD.).

As the colloidal silica, colloidal silica having the above-mentioned surface-modifying group and colloidal silica not having the surface-modifying group may be used in combination, but it is preferable to use only colloidal silica having a surface-modifying group from the viewpoints that then, selectivity of polishing SiN with respect to $SiO_2$ is further improved, defects on a polishing target surface are reduced, and temporal stability of the present polishing liquid is further improved.

In a case where the colloidal silica having the above-mentioned surface-modifying group and the colloidal silica not having the surface-modifying group are used in combination, a content of the colloidal silica having the surface-modifying group is preferably 10 parts by mass or more, more preferably 30 parts by mass or more, even more preferably 50 parts by mass or more, particularly preferably 70 parts by mass or more, and most preferably 90 parts by mass or more, with respect to 100 parts by mass of the colloidal silica (that is, a total of the colloidal silica having the surface-modifying group and the colloidal silica not having the surface-modifying group) from the viewpoints that then, selectivity of polishing SiN with respect to $SiO_2$ is further improved, defects on a polishing target surface are reduced, and temporal stability of the present polishing liquid is further improved.

Furthermore, the upper limit value of the content of the colloidal silica having the surface-modifying group is preferably less than 100 parts by mass with respect to 100 parts by mass of the colloidal silica.

The lower limit value of a content of the colloidal silica is preferably 0.1% by mass or more, more preferably 0.5% by mass or more, and particularly preferably 1.0% by mass or more with respect to a total mass (100% by mass) of the present polishing liquid. In a case where a content of the colloidal silica is 0.1% by mass or more, there are advantages such that a polishing speed for SiN can be increased, and selectivity of polishing SiN with respect to $SiO_2$ can be further improved.

The upper limit value of a content of the colloidal silica is preferably less than 10% by mass, more preferably 8% by mass or less, even more preferably 5% by mass or less, particularly preferably 3% by mass or less, and most preferably 2% by mass or less with respect to a total mass of the present polishing liquid. In a case where a content of colloidal silica is less than 10% by mass, aggregation of the colloidal silica can be inhibited, and therefore, there are advantages such that defects on a polishing target surface can be reduced and temporal stability of the present polishing liquid can be improved.

As the colloidal silica, one kind may be used alone, or two or more kinds may be used in combination. In a case where two or more kinds of colloidal silica are used in combination, a total content thereof is preferably within the above-mentioned range.

<Acid Component>

The present polishing liquid preferably includes an acid component. Use of the acid component makes it easy to adjust pH and electrical conductivity within predetermined ranges.

The acid component is preferably at least one compound selected from the group consisting of a compound having an acid group and a basic group, and phosphoric acid, from the viewpoint of easily adjusting pH and electrical conductivity. An acid group, a basic group, and phosphoric acid may be ionized in the polishing liquid. In addition, the compound having an acid group and a basic group may be a betaine compound.

In the compound having an acid group and a basic group, specific examples of acid groups include a sulfonic acid group, a phosphoric acid group, and the like (among them, a sulfonic acid group is preferable), and specific examples of basic groups include an amino group, a quaternary ammonium group, and a heterocyclic ring group containing nitrogen atoms (a nitrogen-containing heterocyclic ring group), and the like.

The compound having an acid group and a basic group preferably has a cyclic structure. In a case where a compound having a bulky structure such as a cyclic structure is used, it is easy to reduce electrical conductivity, and thereby selectivity of polishing SiN with respect to $SiO_2$ can be further improved.

Specific examples of cyclic structures include a benzene ring and a nitrogen-containing heterocyclic ring.

Specific examples of the compound having an acid group and a basic group include 2-(2-pyridyl)ethanesulfonic acid, 2-(4-pyridyl)ethanesulfonic acid, 1-(3-sulfopropyl)pyridinium hydroxide inner salts, 3-aminobenzenesulfonic acid, sulfanilic acid, 5-amino-2-naphthalene sulfonic acid, 8-amino-1-naphthalenesulfonic acid, taurine, and the like.

A content of the acid component is not particularly limited as long as pH and electrical conductivity can be adjusted within predetermined ranges, but it is preferably 0.000001% to 0.1% by mass, and is more preferably 0.00001% to 0.01% by mass with respect to a total mass of the present polishing liquid.

As the acid component, one kind thereof may be used alone, or two or more kinds thereof may be used in combination. In a case where two or more kinds of acid components are used in combination, a total content thereof is preferably within the above-mentioned range.

<Specific Nitrogen-Containing Heterocyclic Ring Compound>

The present polishing liquid preferably contains a compound having a heterocyclic ring having two or more nitrogen atoms (hereinafter, also referred to as a "specific nitrogen-containing heterocyclic ring compound"). By using the specific nitrogen-containing heterocyclic ring compound, a polishing speed for SiN is further increased.

The number of nitrogen atoms contained in the heterocyclic ring of the specific nitrogen-containing heterocyclic ring compound is 2 or more and is preferably 2 to 4. The specific nitrogen-containing heterocyclic ring compound may have a heteroatom other than nitrogen (for example, an oxygen atom) in the heterocyclic ring. The nitrogen-containing heterocyclic ring contained in the specific nitrogen-containing heterocyclic ring compound is preferably a 5- to 6-membered ring and is more preferably a 5-membered ring.

Examples of specific nitrogen-containing heterocyclic ring compounds include compounds having an imidazole skeleton, a pyrazole skeleton, a triazole skeleton, a tetrazole skeleton, a thiadiazole skeleton, or an oxadiazole skeleton, and a compound having an imidazole skeleton is preferable from the viewpoint of further increasing the polishing speed for SiN.

Furthermore, the specific nitrogen-containing heterocyclic ring compound may be a compound having a polycyclic structure having a fused ring, and specific examples thereof include compounds having a purine skeleton, an indazole skeleton, a benzimidazole skeleton, a benzothiadiazole skeleton, or a naphthimidazole skeleton.

Specific examples of specific nitrogen-containing heterocyclic ring compounds include histidine, imidazole, 4-imidazolecarboxylic acid, 5-methylbenzotriazole, 5-aminobenzotriazole, benzotriazole, 5,6-dimethylbenzotriazole, 3-amino-1,2,4-triazole, 1,2,4-triazole, 3,5-dimethylpyrazole, and pyrazole. Among them, histidine, imidazole, and 4-imidazolecarboxylic acid, which are compounds having an imidazole skeleton, are preferable from the point of further increasing the polishing speed of SiN.

A content of the specific nitrogen-containing heterocyclic ring compound is preferably 0.001% to 1% by mass and more preferably 0.01% to 0.5% by mass with respect to a total mass of the present polishing liquid, from the viewpoint of further increasing a polishing speed for SiN.

As the specific nitrogen-containing heterocyclic ring compound, one kind thereof may be used alone, or two or more kinds thereof may be used in combination. In a case where two or more kinds of specific nitrogen-containing heterocyclic ring compounds are used in combination, a total content thereof is preferably within the above-mentioned range.

<Surfactant>

The present polishing liquid includes a cationic surfactant or an amphoteric surfactant as a surfactant, or may include an anionic surfactant.

In a case where the present polishing liquid includes a cationic surfactant or an amphoteric surfactant, selectivity of polishing of SiN with respect to polysilicon (polycrystalline silicon, hereinafter, also referred to as "poly-Si") can be reduced.

That is, because a surface of poly-Si is hydrophobic, hydrophobic groups of a surfactant is disposed on a surface side of poly-Si, and hydrophilic groups of the surfactant is disposed on a side opposite to the surface side (a position away from the surface of poly-Si). Since a zeta potential of the colloidal silica in the present polishing liquid is negative, attraction by hydrophilic groups (cationic groups) of the surfactant easily occurs. It is considered that this increases polishing speed for poly-Si. It is considered that as a result, a polishing speed for poly-Si is closer to a polishing speed for SiN, and selectivity of polishing of SiN with respect to poly-Si is reduced.

Specific examples of cationic surfactants include aliphatic amine salts, aliphatic quaternary ammonium salts, benzalkonium chloride salts, benzethonium chloride, pyridinium salts, imidazolinium salts, and the like.

A content of the cationic surfactant is preferably 0.0001% to 1% by mass and is more preferably 0.001% to 0.5% by mass with respect to a total mass of the present polishing liquid.

As the cationic surfactant, one kind thereof may be used alone, or two or more kinds thereof may be used in combination. In a case where two or more kinds of cationic surfactants are used in combination, a total content thereof is preferably within the above-mentioned range.

Specific examples of amphoteric surfactants include carboxybetaine type, aminocarboxylic acid salt, imidazolinium betaine, lecithin, alkylamine oxide, and the like.

A content of the amphoteric surfactant is preferably 0.0001% to 1% by mass and is more preferably 0.001% to 0.5% by mass with respect to a total mass of the present polishing liquid.

As the amphoteric surfactant, one kind thereof may be used alone, or two or more kinds thereof may be used in combination. In a case where two or more kinds of amphoteric surfactants are used in combination, a total content thereof is preferably within the above-mentioned range.

In a case where the present polishing liquid includes an anionic surfactant, selectivity of polishing of SiN with respect to polysilicon (hereinafter, also referred to as "poly-Si") can be increased.

That is, because a surface of poly-Si is hydrophobic, hydrophobic groups of a surfactant is disposed on a surface side of poly-Si, and hydrophilic groups of the surfactant is disposed on a side opposite to the surface side (a side away from the surface of poly-Si). Since a zeta potential of the colloidal silica is negative, repelling from hydrophilic groups (anionic groups) of the surfactant occurs. It is considered that this decreases a polishing speed for poly-Si. It is considered that as a result, selectivity of polishing of SiN with respect to poly-Si is increased.

Specific examples of anionic surfactants include carboxylic acid salts, sulfonic acid salts such as alkylbenzene sulfonic acid, sulfuric acid ester salts, phosphoric acid ester salts, and the like.

A content of the anionic surfactant is preferably 0.0001% to 1% by mass and is more preferably 0.001% to 0.5% by mass with respect to a total mass of the present polishing liquid.

As the anionic surfactant, one kind thereof may be used alone, or two or more kinds thereof may be used in combination. In a case where two or more kinds of anionic surfactants are used in combination, a total content thereof is preferably within the above-mentioned range.

<Water>

The present polishing liquid preferably includes water. Water contained in the present polishing liquid is not particularly limited, but ion exchange water, pure water, or the like can be used.

A content of water is not particularly limited, but it is preferably 90% to 99% by mass with respect to a total mass of the present polishing liquid.

<Other Components>

The present polishing liquid may include components (other components) other than the components described above, which are used in the polishing liquid for CMP, as long as the effects of the present invention are not impaired.

Specific examples of other components include a polymer component. Examples of polymer components include water-soluble polymers, and pH adjusters other than the acid components described above, but examples are not limited thereto.

Examples of water-soluble polymers include polymers having a monomer having a carboxyl group as a basic constitutional unit, and salts thereof, and copolymers containing these polymers and salts. Specific examples thereof include polyacrylic acid and salts thereof, and copolymers containing them; polymethacrylic acid and salts thereof, and copolymers containing them; polyamic acids and salts thereof, and copolymers containing them; and polycarboxylic acids such as polymaleic acid, polyitaconic acid, polyfumaric acid, poly(p-styrenecarboxylic acid), and polyglyoxylic acid, and salts thereof, and copolymers containing them.

In addition to the above examples, examples further include vinyl-based polymers such as polyvinyl alcohol, polyvinylpyrrolidone, and polyacrolein.

A content of the polymer component is not particularly limited, and it is preferably 0.01% to 10% by mass with respect to a total mass of the present polishing liquid. As the polymer component, one kind thereof may be used alone, or two or more kinds thereof may be used in combination. In a case where two or more kinds of water-soluble polymers are used in combination, a total content thereof is preferably within the above-mentioned range.

Examples of pH adjusters other than the above-mentioned acid components include hydrochloric acid, sulfuric acid, nitric acid, boric acid, sodium hydroxide, potassium hydroxide, ammonia, and the like, but examples are not limited thereto.

A content of the pH adjuster is not particularly limited, and an amount at which a desired pH is obtained may be appropriately added.

As the ph adjuster, one kind thereof may be used alone, or two or more kinds thereof may be used in combination.

<Physical Properties>

Physical properties of the present polishing liquid will be described below.

(Zeta Potential)

A zeta potential of the colloidal silica measured in a state where the colloidal silica is present in the present polishing liquid is −20 mV or less, is preferably −22 mV or less, and is more preferably −25 mV or less. Accordingly, this improves selectivity of polishing SiN with respect to $SiO_2$.

The lower limit value of the zeta potential of the colloidal silica measured in a state where the colloidal silica is present in the present polishing liquid is preferably −80 mV or higher, and is more preferably −60 mV or higher. This has the advantage of avoiding a problem that particles remain on SiN as a residue due to electrostatic action.

Examples of methods for setting a zeta potential of colloidal silica measured in a state where the colloidal silica is present in the present polishing liquid within the above range include a method using the colloidal silica having the above-mentioned surface-modifying group, but examples are not limited thereto.

In the present invention, a "zeta potential (ζ potential)" means a potential on a "slip plane" of a diffusion electrical double layer present around particles (colloidal silica) in the liquid (present polishing liquid). The "slip plane" is a plane that can be regarded as a hydrodynamic surface of particles in a case where the particles move in a liquid.

The diffusion electrical double layer has a fixing layer formed on a surface side of particles (colloidal silica), and a diffusion layer formed outside the fixing layer. The fixing layer is a layer in which ions are attracted and fixed around particles (colloidal silica) having a charged surface. The diffusion layer is a layer in which ions are freely diffused by thermal motion.

The slip plane is present in a boundary region between the fixing layer and the diffusion layer. In a case where particles are electrophoresed, a migration distance changes depending on potentials (zeta potentials) of the slip plane. Accordingly, a zeta potential of the particles can be measured by electrophoresis.

A zeta potential (mV) of colloidal silica in the present polishing liquid and a thickness (Å) of a diffusion layer can be measured using a zeta potential measuring device DT-1200 (product name, manufactured by Dispersion Technology and sold by Nihon Rufuto Co., Ltd.). A measurement temperature is 25° C.

A thickness of the diffusion layer in the diffusion electrical double layer is preferably 10 to 1000 Å and is more preferably 15 to 800 Å.

In a case where the thickness of the diffusion layer is within the above range, repulsive force between colloidal silica particles can be improved, and thereby aggregation of the colloidal silica particles can be inhibited.

Examples of methods of adjusting the thickness of the diffusion layer within the above range include a method of reducing electrical conductivity, but examples are not limited thereto.

In a case where a pH of the present polishing liquid is denoted by X and a zeta potential of colloidal silica measured in a state where the colloidal silica is present in the present polishing liquid is denoted by Y, a zeta potential in a case where a pH of the present polishing liquid is set to X+1 (that is, the pH is adjusted to be 1 greater than X), and a zeta potential in a case where a pH of the present polishing liquid is set to X−1 (that is, the pH is adjusted to be 1 less than X) are both preferably within a range of Y±5 [mV], and more preferably within a range of Y±3 [mV]. Accordingly, temporal stability of the present polishing liquid is further improved.

Examples of methods of changing a pH (that is, a method of adjusting a pH to X+1 or X−1) include a method of adding a known pH adjuster to the present polishing liquid. Examples of pH adjusters include hydrochloric acid, potassium hydroxide, and the like.

As described above, in a case where a pH of the present polishing liquid is changed, examples of methods of reducing a change width of zeta potentials of the present polishing liquid include a method of adjusting an electrical conductivity of the present polishing liquid, a transmittance of the present polishing liquid, a pH of the present polishing liquid, a zeta potential of colloidal silica, a thickness of a diffusion layer, a particle size of colloidal silica, an aspect ratio of colloidal silica, and the like.

A method of measuring X, which is a pH of the present polishing liquid, will be described in detail later.

(Electrical Conductivity)

An electrical conductivity of the present polishing liquid is 200 μS/cm or less, and from the viewpoint of further improving selectivity of polishing SiN with respect to $SiO_2$, it is preferably 190 μS/cm or less and is more preferably 180 μS/cm or less.

The lower limit value of the electrical conductivity is preferably 0.05 μS/cm or more, more preferably 0.1 μS/cm or more, and particularly preferably 0.15 μS/cm or more, from the viewpoint of stability of a liquid composition.

An electrical conductivity of the present polishing liquid can be measured by an electrical conductivity meter, and a measurement temperature is 25° C. As the electrical conductivity meter, it is possible to use a device conforming to "LAQUA series" (product name, manufactured by HORIBA, Ltd.).

Examples of methods of adjusting an electrical conductivity within the above range include a method of adding an acid component, but examples are not limited thereto.

(PH)

A pH of the present polishing liquid is 2 to 6, it is preferably 3 to 5 from the viewpoint that selectivity of polishing SiN with respect to $SiO_2$ is then further improved, and it is more preferably 4 to 5 from the viewpoint that defects can then be further inhibited from occurring on a polishing target surface.

A pH of the present polishing liquid can be measured with a pH meter, and a measurement temperature is 25° C. As the pH meter, it is possible to use "LAQUA series" (product name, manufactured by HORIBA, Ltd.).

Examples of methods of adjusting a pH within the above range include a method of adding an acid component, and a method of adding a pH adjuster, but examples are not limited thereto.

(Transmittance)

A transmittance of the present polishing liquid is 70% to 99%. The lower limit value of the transmittance is preferably 85% or more and more preferably 90% or more from the viewpoint that then, generation of defects on a polishing target surface can be further reduced and temporal stability of the present polishing liquid is further improved.

A transmittance of the present polishing liquid means a transmittance (%) of light having a wavelength of 450 nm measured using the present polishing liquid at an optical path length of 1 cm. A transmittance can be measured using a multi-channel spectroscope, and a measurement temperature is 25° C. As the multi-channel spectroscope, it is possible to use a device conforming to "MCPD-9800" (product name, manufactured by Otsuka Electronics Co., Ltd.). A transmittance of pure water can be used as a reference as necessary.

Examples of methods of adjusting a transmittance within the above range include a method of adjusting a content of colloidal silica, and a method of adjusting an electrical conductivity, but examples are not limited thereto.

<Ratio of Polishing Speed>

In a case where the present polishing liquid is used for polishing SiN, $SiO_2$, and derivatives thereof, a ratio of a polishing speed for SiN and derivatives thereof to a polishing speed for $SiO_2$ and derivatives thereof is preferably 2 or more, more preferably 10 or more, and particularly preferably 15 or more. The upper limit value of the ratio of polishing speeds is not particularly limited, but it is preferably 100 or less.

A ratio of a polishing speed for SiN and derivatives thereof to a polishing speed for $SiO_2$ and derivatives thereof means a ratio of a polishing speed of SiN to a polishing speed of $SiO_2$, a ratio of a polishing speed of SiN to a polishing speed of derivatives of $SiO_2$, a ratio of a polishing speed of derivatives of SiN to a polishing speed of $SiO_2$, and a ratio of a polishing speed of derivatives of SiN to a polishing speed of derivatives of $SiO_2$.

Specific examples of derivatives of $SiO_2$ include SiOC and $SiO_2$ that has been subjected to a doping treatment.

Specific examples of derivatives of SiN include SiON and SiN that has been subjected to a doping treatment.

In a case where the present polishing liquid includes the above-mentioned cationic surfactant or amphoteric surfactant and the present polishing liquid is used for polishing SiN, poly-Si, and derivatives thereof, a ratio of a polishing speed of SiN and derivatives thereof to a polishing speed of poly-Si and derivatives thereof is preferably 0.25 to 4, more preferably 0.25 to 3, and even more preferably 0.25 to 2.

On the other hand, in a case where the present polishing liquid includes the above-mentioned anionic surfactant and the present polishing liquid is used for polishing SiN, poly-Si, and derivatives thereof, a ratio of a polishing speed of SiN and derivatives thereof to a polishing speed of poly-Si and derivatives thereof is preferably 4 to 100 and is more preferably 50 to 100.

A ratio of a polishing speed for SiN and derivatives thereof to a polishing speed for poly-Si and derivatives thereof means a ratio of a polishing speed of SiN to a polishing speed of poly-Si, a ratio of a polishing speed of SiN to a polishing speed of derivatives of poly-Si, a ratio of a polishing speed of derivatives of SiN to a polishing speed of poly-Si, and a ratio of a polishing speed of derivatives of SiN to a polishing speed of derivatives of poly-Si.

Specific examples of derivatives of poly-Si include poly-Si (modified polysilicon) that has been subjected to a doping treatment, and the like.

<Method for Producing Present Polishing Liquid>

A method for producing the present polishing liquid is not particularly limited, and a known production method can be used.

For example, each of the above-mentioned components may be mixed to a predetermined concentration to produce the present polishing liquid, or a concentrated liquid may be prepared and then diluted to produce the present polishing liquid.

[Chemical Mechanical Polishing Method]

A chemical mechanical polishing method of the embodiment of the present invention (hereinafter, also referred to as a "present CMP method") includes a step of bringing a polishing target surface of a polishing target object into contact with a polishing pad while supplying the above-described polishing liquid to the polishing pad attached to a polishing platen, relatively moving the polishing target object and the polishing pad to polish the polishing target surface, and obtaining a polished polishing target object.

<Polishing Target Object>

The polishing target object preferably contains SiN and $SiO_2$, and more preferably further contains poly-Si.

Specific examples of polishing target objects include a substrate, and a laminate having a SiN layer and a $SiO_2$ layer on the substrate. A poly-Si layer may be further disposed on the substrate of the laminate. Each of the layers may be disposed in a thickness direction, or may be disposed in a direction intersecting the thickness direction.

According to the present CMP method, the SiN layer, the $SiO_2$ layer, and the poly-Si layer are polished.

Specific examples of substrates include a single-layered semiconductor substrate and a multi-layered semiconductor substrate.

Specific examples of materials forming the single-layered semiconductor substrate include silicon, silicon germanium, a group III-V compound such as GaAs, or any combination thereof.

Specific example of multi-layered semiconductor substrates include a substrate in which an exposed integrated circuit structure such as interconnect features such as metal wires and dielectric materials is disposed on the above-mentioned semiconductor substrate such as silicon.

<Polishing Device>

A known chemical mechanical polishing device (hereinafter, also referred to as a "CMP device") can be used as a polishing device that can perform the present CMP method.

Examples of CMP devices include a general CMP device having a holder for holding a polishing target object having a polishing target surface, and a polishing platen to which a polishing pad is attached (to which a motor or the like of which a rotation speed can be changed is attached). Examples of commercially available products of the CMP device include Reflexion (manufactured by Applied Materials, Inc.).

<Polishing Pressure>

A polishing pressure in the present CMP method is preferably 3,000 to 25,000 Pa and is more preferably 6,500 to 14,000 Pa. The polishing pressure means a pressure generated on a contact surface between a polishing target surface and a polishing pad.

<Rotation Speed for Polishing Platen>

The rotation speed for a polishing platen in the present CMP method is preferably 50 to 200 rpm and is more preferably 60 to 150 rpm.

In order to relatively move a polishing target object and the polishing pad, the holder may be rotated and/or rocked, the polishing platen may be rotated by planetary rotation, or a belt-shaped polishing pad may be moved linearly in one of longitudinal directions. In addition, the holder may be in any state of being fixed, rotating, or rocked. These polishing methods can be appropriately selected depending on polishing target surfaces and/or polishing devices as long as a polishing target object and the polishing pad are relatively moved.

<Method of Supplying Polishing Liquid>

In the present CMP method, it is preferable to continuously supply the present polishing liquid to the polishing pad on the polishing platen by a pump or the like while polishing a polishing target surface. Although a supply amount of the present polishing liquid is not limited, it is preferable that a surface of the polishing pad be always covered with the present polishing liquid.

EXAMPLES

Hereinafter, the present invention will be described in more detail based on examples. In the following Examples, materials to be used, amounts and ratios thereof, the details of the treatment or the treatment procedures, and the like may be suitably modified without departing from the scope of the present invention. Accordingly, the scope of the present invention should not be limitedly interpreted by the following examples. The symbol "%" means "% by mass" unless otherwise specified.

Examples 1A to 35A and Comparative Examples 1A to 5A

Components shown in Table 1 were respectively mixed to prepare polishing liquids of each of Examples and Comparative Examples.

An acid component was added such that a pH was adjusted to a value shown in Table 1.

However, regarding Examples 16A to 18A, hydrochloric acid and/or sodium hydroxide as pH adjusters were added together with an acid component shown in Table 1 such that a pH was adjusted to a value shown in Table 1. An amount of the pH adjuster added was 0.1% by mass or less with respect to a total mass of the polishing liquid in each of Examples 16A to 18A.

The outline of the components shown in Table 1 is shown below.

<Colloidal Silica>

- PL1D (product name, manufactured by FUSO CHEMICAL CO., LTD., colloidal silica having a sulfonic acid group on a surface thereof, average primary particle size: 10 nm, aspect ratios: 1.8, degree of association: 2)
- PL07D (product name, manufactured by FUSO CHEMICAL CO., LTD., colloidal silica having a sulfonic acid group on a surface thereof, average primary particle size: 7 nm, aspect ratios: 1.8, degree of association: 2)
- PL2D (product name, manufactured by FUSO CHEMICAL CO., LTD., colloidal silica having a sulfonic acid group on a surface thereof, average primary particle size: 20 nm, aspect ratios: 1.8, degree of association: 2)
- PL3D (product name, manufactured by FUSO CHEMICAL CO., LTD., colloidal silica having a sulfonic acid group on a surface thereof, average primary particle size: 35 nm, aspect ratios: 1.8, degree of association: 2)
- PL1 (product name, manufactured by FUSO CHEMICAL CO., LTD., colloidal silica, average primary particle size: 10 nm, aspect ratios: 1.8, degree of association: 2)
- PL3 (product name, manufactured by FUSO CHEMICAL CO., LTD., colloidal silica, average primary particle size: 35 nm, aspect ratios: 1.8, degree of association: 2)

<Acid Component>

- Phosphoric acid
- 2-(4-Pyridyl) ethanesulfonic acid (a compound having an acid group and a basic group and having a cyclic structure)
- 2-(2-Pyridyl) ethanesulfonic acid (a compound having an acid group and a basic group and having a cyclic structure)
- 1-(3-Sulfopropyl)pyridinium hydroxide inner salts (a compound having an acid group and a basic group and having a cyclic structure)
- 3-Aminobenzenesulfonic acid (a compound having an acid group and a basic group and having a cyclic structure)
- Sulfanilic acid (a compound having an acid group and a basic group and having a cyclic structure)
- 5-Amino-2-naphthalenesulfonic acid (a compound having an acid group and a basic group and having a cyclic structure)

8-Amino-1-naphthalenesulfonic acid (a compound having an acid group and a basic group and having a cyclic structure)

<Specific Nitrogen-Containing Heterocyclic Ring Compound>

Histidine

4-Imidazolecarboxylic acid

Imidazole

<Surfactant>

DBSA (dodecylbenzene sulfonic acid, anionic surfactant)

Takesurf-A43-N (product name, manufactured by TAKEMOTO OIL & FAT Co., Ltd., anionic surfactant)

Cetyltrimethylammonium chloride (cationic surfactant)

Cetylpyridinium chloride (cationic surfactant)

<pH Adjuster>

Hydrochloric acid and/or sodium hydroxide

<Water>

Water (pure water)

[Measurement of Physical Properties]<PH>

A pH of the polishing liquid at 25° C. was measured using a pH meter (product name "LAQUA series," manufactured by HORIBA, Ltd.).

<Zeta Potential and Thickness of Diffusion Layer>

A zeta potential (mV) of colloidal silica in the polishing liquid and a thickness (A) of a diffusion layer were measured using a zeta potential measuring device DT-1200 (product name, manufactured by Dispersion Technology and sold by Nihon Rufuto Co., Ltd.). A temperature of the polishing liquid in a case of measurement was 25° C.

<Changes in Zeta Potential in Case of Changing pH>

A measurement sample A to which an aqueous solution of potassium hydroxide was added as a pH adjuster such that a pH of the polishing liquid measured as described above was increased by 1 (for example, in Example 1A, a pH of the polishing liquid was adjusted to 3), and a measurement sample B to which hydrochloric acid was added as a pH adjuster such that a pH of the polishing liquid measured as described above was decreased by 1 (for example, in Example 1A, a pH of the polishing liquid was adjusted to 1) were prepared. Using the measurement sample A and the measurement sample B, a zeta potential was measured by the same method as in the measurement of the zeta potential described above.

Using a value of a zeta potential before changing a pH as a reference, a change value (refer to the following formula) of a zeta potential value after changing a pH (measurement sample A and measurement sample B) was calculated, and a value with the maximum change value was defined as a zeta potential change value (mV) in case of changing pH.

Change value of zeta potential=|(value of zeta potential before changing pH)−(value of zeta potential after changing pH)|

<Electrical Conductivity>

A electrical conductivity (μS/cm) of the polishing liquid at 25° C. was measured using an electrical conductivity meter (product name "LAQUA series," manufactured by HORIBA, Ltd.).

<Transmittance>

A transmittance of the polishing liquid at a wavelength of 450 nm at 25° C. was measured using a multi-channel spectroscope (product name "MCPD-9800," manufactured by Otsuka Electronics Co., Ltd.). A cell having an optical path length of 1 cm was used for measuring a transmittance.

Then, a rate (%) of the measured transmittance of the polishing liquid to the transmittance at a wavelength of 450 nm measured using pure water was obtained. The value thus obtained was defined as the transmittance.

[Evaluation Test] <Polishing Speed>

Calculation of polishing speed: blanket wafers of SiN, $SiO_2$, and poly-Si were respectively polished for 60 seconds, a film thickness difference between before and after polishing was obtained for 49 evenly-spaced locations on wafer surfaces, and a value obtained by dividing the film thickness difference by the polishing time was defined as a polishing speed (unit: nm/min). Table 1 shows the results.

Polishing device: Reflexion (manufactured by Applied Materials, Inc.)

Polishing pad: IC1010 (manufactured by Rodel)

Polishing conditions:

Polishing pressure (contact pressure between a polishing target surface and a polishing pad): 1.5 psi (in the present specification, psi means pound-force per square inch, and 1 psi=6894.76 Pa)

Supply rate of polishing liquid: 200 ml/min

Rotation speed for polishing platen: 110 rpm

Rotation speed for polishing head: 100 rpm

<Selection Ratio>

From the polishing speed of each of the wafers calculated as described above, a ratio of the polishing speed for SiN to the polishing speed for $SiO_2$ (selection ratio ($SiN/SiO_2$)) and a ratio of the polishing speed for SiN to the polishing speed for poly-Si (selection ratio (SiN/poly-Si)) were respectively obtained.

<Defects>

In the same manner as in the above polishing speed calculation, the blanket wafer of SiN which had been polished for 60 seconds was evaluated for defects (scratches) on a polishing target surface thereof by Surfscan SP2 (product name, manufactured by KLA), which is a wafer inspection device.

A: The number of defects after polishing is 20 or less

B: The number of defects after polishing is 21 to 30

C: The number of defects after polishing is 31 to 50

D: The number of defects after polishing is 51 to 60

E: The number of defects after polishing is 61 to 80

F: The number of defects after polishing is 81 or more

<Temporal Stability>

Each of the polishing liquids was stored at 40° C. for 30 days. Using a particle size distribution analyzer SALD-2300 (manufactured by Shimadzu Corporation), particle size distribution of each of colloidal silica immediately after preparation (initial colloidal silica) and colloidal silica after storage was measured to obtain respective average particle sizes (a value of 50% diameter obtained by calculating a volume average: D50), and temporal stability of the polishing liquid was evaluated by a ratio calculated from the following formula.

T3=(average particle size of colloidal silica after storage)/(average particle size of initial colloidal silica)

A: T3 is 1.1 or less

B: T3 is more than 1.1 and 1.3 or less

C: T3 is more than 1.3 and 1.5 or less

D: T3 is more than 1.5 and 1.8 or less

E: T3 is more than 1.8 and 2.0 or less

F: T3 is more than 2.0

Table 1 shows values of each of the physical properties measured as described above and the results of each of the evaluation tests. In the table, "A<" or ">A" (where A represents a numerical value) means that a value is larger than A, and "<A" means that a value is smaller than A.

TABLE 1

| Table 1 (part 1) | Composition of polishing liquid: Colloidal silica Type | Colloidal silica Content | Acid component Type | Acid component Content | Other additives Type | Other additives Content | Water Content |
|---|---|---|---|---|---|---|---|
| Example 1A | PL1D | 1.5% | Phosphoric acid | Amount that can adjust pH (<0.1%) | — | — | Residue |
| Example 2A | PL1D | 1.5% | Phosphoric acid | Amount that can adjust pH (<0.1%) | — | — | Residue |
| Example 3A | PL1D | 1.5% | Phosphoric acid | Amount that can adjust pH (<0.1%) | — | — | Residue |
| Example 4A | PL1D | 1.5% | Phosphoric acid | Amount that can adjust pH (<0.1%) | — | — | Residue |
| Example 5A | PL1D | 1.5% | Phosphoric acid | Amount that can adjust pH (<0.1%) | — | — | Residue |
| Example 6A | PL1D | 1.5% | Phosphoric acid | Amount that can adjust pH (<0.1%) | Histidine | 0.05% | Residue |
| Example 7A | PL1D | 1.5% | Phosphoric acid | Amount that can adjust pH (<0.1%) | 4-Imidazolecarboxylic acid | 0.05% | Residue |
| Example 8A | PL1D | 1.5% | Phosphoric acid | Amount that can adjust pH (<0.1%) | Imidazole | 0.05% | Residue |
| Example 9A | PL07D | 1.5% | Phosphoric acid | Amount that can adjust pH (<0.1%) | — | — | Residue |
| Example 10A | PL2D | 1.5% | Phosphoric acid | Amount that can adjust pH (<0.1%) | — | — | Residue |
| Example 11A | PL3D | 1.5% | Phosphoric acid | Amount that can adjust pH (<0.1%) | — | — | Residue |
| Example 12A | PL1D | 1.0% | Phosphoric acid | Amount that can adjust pH (<0.1%) | — | — | Residue |
| Example 13A | PL1D | 2.0% | Phosphoric acid | Amount that can adjust pH (<0.1%) | — | — | Residue |
| Example 14A | PL1D | 3.0% | Phosphoric acid | Amount that can adjust pH (<0.1%) | — | — | Residue |
| Example 15A | PL1D | 5.0% | Phosphoric acid | Amount that can adjust pH (<0.1%) | — | — | Residue |
| Example 16A | PL1D | 1.5% | Phosphoric acid | 300 ppm | PH adjuster | 0.1% or less | Residue |
| Example 17A | PL1D | 1.5% | Phosphoric acid | 500 ppm | PH adjuster | 0.1% or less | Residue |
| Example 18A | PL1D | 1.5% | Phosphoric acid | 1000 ppm | PH adjuster | 0.1% or less | Residue |

| Table 1 (part 1) | Physical properties: Electrical conductivity (μS/cm) | Transmittance | Zeta potential (mV) | Changes in zeta potential in case of changing pH (mV) | Thickness of diffusion layer (Å) | pH |
|---|---|---|---|---|---|---|
| Example 1A | 102 | 92% | −28 | <3 | 26 | 2 |
| Example 2A | 85 | 92% | −28 | <3 | 31 | 3 |
| Example 3A | 65 | 91% | −28 | <3 | 41 | 4 |
| Example 4A | 55 | 93% | −28 | <3 | 48 | 5 |
| Example 5A | 45 | 92% | −28 | <3 | 59 | 6 |
| Example 6A | 45 | 92% | −28 | <3 | 59 | 4 |
| Example 7A | 45 | 92% | −28 | <3 | 59 | 4 |
| Example 8A | 45 | 92% | −28 | <3 | 59 | 4 |
| Example 9A | 63 | 98% | −30 | <3 | 42 | 4 |
| Example 10A | 65 | 85% | −26 | <3 | 41 | 4 |
| Example 11A | 68 | 73% | −22 | <3 | 39 | 4 |
| Example 12A | 62 | 95% | −29 | <3 | 43 | 4 |
| Example 13A | 64 | 90% | −27 | <3 | 41 | 4 |
| Example 14A | 68 | 88% | −27 | <3 | 39 | 4 |
| Example 15A | 69 | 80% | −24 | <3 | 38 | 4 |

TABLE 1-continued

| | | | | | | |
|---|---|---|---|---|---|---|
| Example 16A | 89 | 91% | −28 | <5 | 30 | 4 |
| Example 17A | 125 | 90% | −27 | <8 | 21 | 4 |
| Example 18A | 189 | 88% | −27 | <10 | 14 | 4 |

| | Evaluation results | | | | | | |
|---|---|---|---|---|---|---|---|
| Table 1 (part 1) | Polishing speed for SiN (nm/min) | Polishing speed for $SiO_2$ (nm/min) | Polishing speed for poly-Si (nm/min) | Selection ratio SiN/$SiO_2$ | Selection ratio SiN/poly-Si | Defect | Temporal stability |
| Example 1A | 289 | 21 | — | 13.8 | — | B | A |
| Example 2A | 279 | 15 | — | 18.6 | — | B | A |
| Example 3A | 269 | 10 | 32 | 26.9 | 8.4 | A | A |
| Example 4A | 264 | 9 | — | 29.3 | — | A | A |
| Example 5A | 261 | 15 | — | 17.4 | — | B | A |
| Example 6A | 321 | 8 | 22 | 40.1 | — | A | A |
| Example 7A | 358 | 7 | 21 | 51.1 | — | A | A |
| Example 8A | 338 | 9 | 20 | 37.6 | — | A | A |
| Example 9A | 213 | 5 | — | 42.6 | — | A | A |
| Example 10A | 315 | 18 | — | 17.5 | — | B | A |
| Example 11A | 389 | 25 | — | 15.6 | — | C | A |
| Example 12A | 242 | 6 | — | 40.3 | — | A | A |
| Example 13A | 289 | 12 | — | 24.1 | — | A | A |
| Example 14A | 325 | 18 | — | 18.1 | — | A | A |
| Example 15A | 456 | 28 | — | 16.3 | — | A | A |
| Example 16A | 289 | 21 | — | 13.8 | — | B | A |
| Example 17A | 295 | 35 | — | 8.4 | — | B | A |
| Example 18A | 312 | 42 | — | 7.4 | — | C | B |

| | Composition of polishing liquid | | | | | | |
|---|---|---|---|---|---|---|---|
| Table 1 | Colloidal silica | | Acid component | | Other additives | | Water |
| (part 2) | Type | Content | Type | Content | Type | Content | Content |
| Example 19A | PL1D/PL1 (mass ratio: 9/1) | 1.5% | Phosphoric acid | Amount that can adjust pH (<0.1%) | — | — | Residue |
| Example 20A | PL1D/PL1 (mass ratio: 7/3) | 1.5% | Phosphoric acid | Amount that can adjust pH (<0.1%) | — | — | Residue |
| Example 21A | PL1D/PL1 (mass ratio: 5/5) | 1.5% | Phosphoric acid | Amount that can adjust pH (<0.1%) | — | — | Residue |
| Example 22A | PL1D/PL1 (mass ratio: 3/7) | 1.5% | Phosphoric acid | Amount that can adjust pH (<0.1%) | — | — | Residue |
| Example 23A | PL1D/PL1 (mass ratio: 1/9) | 1.5% | Phosphoric acid | Amount that can adjust pH (<0.1%) | — | — | Residue |
| Example 24A | PL1D | 1.5% | 2-(4-Pyridyl) ethanesulfonic acid | Amount that can adjust pH (<0.1%) | — | — | Residue |
| Example 25A | PL1D | 1.5% | 2-(4-Pyridyl) ethanesulfonic acid | Amount that can adjust pH (<0.1%) | Imidazole | 0.05% | Residue |
| Example 26A | PL1D | 1.5% | 2-(2-Pyridyl) ethanesulfonic acid | Amount that can adjust pH (<0.1%) | — | — | Residue |
| Example 27A | PL1D | 1.5% | 1-(3-Sulfopropyl)pyridinium hydroxide inner salt | Amount that can adjust pH (<0.1%) | — | — | Residue |
| Example 28A | PL1D | 1.5% | 3-Aminobenzenesulfonic acid | Amount that can adjust pH (<0.1%) | — | — | Residue |
| Example 29A | PL1D | 1.5% | Sulfanilic acid | Amount that can adjust pH (<0.1%) | — | — | Residue |
| Example 30A | PL1D | 1.5% | 5-Amino-2-naphthalenesulfonic acid | Amount that can adjust pH (<0.2%) | — | — | Residue |
| Example 31A | PL1D | 1.5% | 8-Amino-1-naphthalenesulfonic acid | Amount that can adjust pH (<0.2%) | — | — | Residue |

TABLE 1-continued

| Table 1 (part 2) | Physical properties: Electrical conductivity (μS/cm) | Transmittance | Zeta potential (mV) | Changes in zeta potential in case of changing pH (mV) | Thickness of diffusion layer (Å) | pH |
|---|---|---|---|---|---|---|
| Example 19A | 51 | 88% | −24 | <6 | 52 | 4 |
| Example 20A | 53 | 85% | −24 | <8 | 50 | 4 |
| Example 21A | 56 | 84% | −22 | <10 | 47 | 4 |
| Example 22A | 58 | 80% | −21 | <12 | 46 | 4 |
| Example 23A | 59 | 76% | −20 | <15 | 45 | 4 |
| Example 24A | 48 | 94% | −29 | <3 | 55 | 4 |
| Example 25A | 48 | 94% | −29 | <3 | 55 | 4 |
| Example 26A | 43 | 95% | −29 | <3 | 62 | 4 |
| Example 27A | 48 | 96% | −29 | <3 | 55 | 4 |
| Example 28A | 47 | 94% | −29 | <3 | 56 | 4 |
| Example 29A | 46 | 93% | −28 | <3 | 58 | 4 |
| Example 30A | 45 | 92% | −28 | <3 | 59 | 4 |
| Example 31A | 48 | 93% | −28 | <3 | 55 | 4 |

| Table 1 (part 2) | Evaluation results: Polishing speed for SiN (nm/min) | Polishing speed for $SiO_2$ (nm/min) | Polishing speed foi poly-Si (nm/min) | Selection ratio $SiN/SiO_2$ | Selection ratio SiN/poly-Si | Defect | Temporal stability |
|---|---|---|---|---|---|---|---|
| Example 19A | 261 | 25 | — | 10.4 | — | A | A |
| Example 20A | 232 | 32 | — | 7.3 | — | C | C |
| Example 21A | 201 | 38 | — | 5.3 | — | D | D |
| Example 22A | 158 | 41 | — | 3.9 | — | D | D |
| Example 23A | 132 | 56 | — | 2.4 | — | E | E |
| Example 24A | 364 | 7 | 28 | 49.3 | 13.0 | A | A |
| Example 25A | 401 | 5 | 20 | 80.2 | 20.1 | A | A |
| Example 26A | 407 | 7 | 26 | 61.5 | 15.6 | A | A |
| Example 27A | 364 | 7 | 27 | 49.3 | 13.5 | A | A |
| Example 28A | 372 | 7 | 28 | 51.4 | 13.3 | A | A |
| Example 29A | 380 | 7 | 27 | 53.7 | 14.1 | A | A |
| Example 30A | 389 | 7 | 31 | 56.1 | 12.5 | A | A |
| Example 31A | 364 | 7 | 25 | 49.3 | 14.6 | A | A |

| Table 1 | Composition of polishing liquid: Colloidal silica | | Acid component | | Other additives | | Water |
|---|---|---|---|---|---|---|---|
| (part 3) | Type | Content | Type | Content | Type | Content | Content |
| Example 32A | PL1D | 1.5% | Phosphoric acid | Amount that can adjust pH (<0.3%) | DBSA | 0.01% | Residue |
| Example 33A | PL1D | 1.5% | Phosphoric acid | Amount that can adjust pH (<0.4%) | Takesurf-A43-N | 0.01% | Residue |
| Example 34A | PL1D | 1.5% | Phosphoric acid | Amount that can adjust pH (<0.5%) | Cetyltrimethylammonium chloride | 0.01% | Residue |
| Example 35A | PL1D | 1.5% | Phosphoric acid | Amount that can adjust pH (<0.6%) | Cetylpyridinium chloride | 0.01% | Residue |
| Comparative Example 1A | PL3D | 10.0% | Phosphoric acid | Amount that can adjust pH (<0.6%) | — | — | Residue |
| Comparative Example 2A | PL1D | 0.01% | Phosphoric acid | Amount that can adjust pH (<0.6%) | — | — | Residue |
| Comparative Example 3A | PL3D | 1.5% | Phosphoric acid | 0.5% | — | — | Residue |
| Comparative Example 4A | PL3 | 1.5% | Phosphoric acid | Amount that can adjust pH (<0.1%) | — | — | Residue |

TABLE 1-continued

| | | | | | | | |
|---|---|---|---|---|---|---|---|
| Comparative Example 5A | PL1D | 1.5% | Phosphoric acid | Amount that can adjust pH (<0.1%) | — | — | Residue |

| Table 1 (part 3) | Physical properties | | | | | |
|---|---|---|---|---|---|---|
| | Electrical conductivity (μS/cm) | Transmittance | Zeta potential (mV) | Changes in zeta potential in case of changing pH (mV) | Thickness of diffusion layer (Å) | pH |
| Example 32A | 68 | 93% | −28 | <3 | 39 | 4 |
| Example 33A | 67 | 92% | −28 | <3 | 40 | 4 |
| Example 34A | 69 | 92% | −28 | <3 | 38 | 4 |
| Example 35A | 71 | 91% | −28 | <3 | 37 | 4 |
| Comparative Example 1A | 68 | 68% | −21 | <8 | 32 | 4 |
| Comparative Example 2A | 69 | >99% | −31 | <8 | 58 | 4 |
| Comparative Example 3A | >300 | 65% | −6 | <8 | <1 | 4 |
| Comparative Example 4A | 65 | 70% | 3 | <10 | 41 | 4 |
| Comparative Example 5A | 41 | 95% | −42 | <5 | 65 | 8 |

| Table 1 (part 3) | Evaluation results | | | | | | |
|---|---|---|---|---|---|---|---|
| | Polishing speed for SiN (nm/min) | Polishing speed for $Si0_2$ (nm/min) | Polishing speed for poly-Si (nm/min) | Selection ratio $SiN/Si0_2$ | Selection ratio SiN/poly-Si | Defect | Temporal stability |
| Example 32A | 257 | 10 | 4 | 24.6 | 64.3 | A | A |
| Example 33A | 261 | 10 | 3 | 25.3 | 87.0 | A | A |
| Example 34A | 253 | 11 | 105 | 23.9 | 2.4 | A | A |
| Example 35A | 246 | 11 | 79 | 22.5 | 3.1 | A | A |
| Comparative Example 1A | 358 | 85 | 89 | 4.21 | 4.02 | F | F |
| Comparative Example 2A | 5 | 6 | 15 | 0.83 | 0.33 | A | A |
| Comparative Example 3A | 265 | 185 | 42 | 1.43 | 6.31 | F | F |
| Comparative Example 4A | 153 | 265 | 58 | 0.58 | 2.64 | F | F |
| Comparative Example 5A | 32 | 58 | 125 | 0.55 | 0.26 | F | B |

As shown in Table 1, it was shown that selectivity of polishing SiN with respect to $SiO_2$ was high, defects were less likely to be generated on a polishing target surface, and temporal stability of the polishing liquid was also excellent in a case of using the polishing liquid in which the zeta potential of the colloidal silica measured in the state where the colloidal silica was present in the polishing liquid was −20 mV or less, the electrical conductivity was 200 μS/cm or less, the pH was 2 to 6, and the transmittance was 70% to 99%.

Based on the comparison of Examples 1A to 5A, it was shown that selectivity of polishing SiN with respect to $SiO_2$ was high in a case where the pH of the polishing liquid was within the range of 3 to 5 (Examples 2A to 4A).

Based on the comparison between Example 3A and Examples 6A to 8A, it was shown that selectivity of polishing SiN with respect to $SiO_2$ was further increased in a case where the polishing liquid contained the specific nitrogen-containing heterocyclic ring compound (Examples 6A to 8A).

Based on the comparison between Examples 3A and 9A to 11A, it was shown that defects on a polishing target surface were further reduced by using the colloidal silica having an average primary particle size of 15 nm or less (Examples 3A and 9A).

Based on the comparison of Examples 12A to 15A, it was shown that as a content of the colloidal silica decreased, selectivity of polishing SiN with respect to $SiO_2$ was increased.

Based on the comparison between Examples 19A to 23A, it was shown that, in a case where a rate of a content of the colloidal silica having a surface-modifying group with respect to a content of the colloidal silica not having a surface-modifying group was higher, generation of defects on a polishing target surface was reduced, and temporal stability of the polishing liquid was improved.

Based on the comparison between Example 3A and Examples 24A to 31A, it was shown that selectivity of polishing SiN with respect to $SiO_2$ was increased in a case where the compound having an acid group and a basic group was used as the acid component.

Based on the comparison between Example 3A and Examples 32A and 33A, it was shown that selectivity of SiN with respect to poly-Si was increased in a case of using an anionic surfactant (Examples 32A and 33A).

Based on the comparison between Example 3A and Examples 34A and 35A, it was shown that selectivity of SiN with respect to poly-Si was decreased in a case of using a cationic surfactant (Examples 32A and 33A).

On the other hand, it was shown that many defects were generated on a polishing target surface, and temporal stability of the polishing liquid deteriorated in a case where the polishing liquid having a transmittance of less than 70% was used (Comparative Example 1A).

In addition, it was shown that selectivity of polishing SiN with respect to $SiO_2$ deteriorated in a case where the polishing liquid having a transmittance of more than 99% was used (Comparative Example 2A).

Furthermore, it was shown that selectivity of SiN polishing with respect to $SiO_2$ deteriorated, many defects were generated on a polishing target surface, and temporal stability of the polishing liquid deteriorated in a case where the polishing liquid having an electrical conductivity of more than 200 μS/cm and a zeta potential of more than −20 mV was used (Comparative Example 3A).

Furthermore, it is shown that selectivity of polishing SiN with respect to $SiO_2$ deteriorated, many defects were generated on a polishing target surface, and temporal stability of the polishing liquid deteriorated in a case where the polishing liquid having a zeta potential of more than −20 mV was used (Comparative Example 4A).

Furthermore, it was shown that selectivity of polishing SiN with respect to $SiO_2$ deteriorated, and many defects were generated on a polishing target surface in a case where the polishing liquid having a pH higher than 6 was used (Comparative Example 5A).

What is claimed is:

1. A polishing liquid used for chemical mechanical polishing, the polishing liquid comprising:

colloidal silica, wherein a zeta potential of the colloidal silica measured in a state where the colloidal silica is present in the polishing liquid is −20 mV or less, an electrical conductivity is 200 μS/cm or less, a pH is 2 to 6, and a transmittance is 70% to 99%.

2. The polishing liquid according to claim 1, wherein an average aspect ratio of the colloidal silica is 1.5 to 2.0.

3. The polishing liquid according to claim 1, wherein a diffusion electrical double layer is formed on a surface of the colloidal silica, the diffusion electrical double layer has a fixing layer formed on the surface side of the colloidal silica, and a diffusion layer formed outside the fixing layer, and a thickness of the diffusion layer is 10 to 1,000 Å.

4. The polishing liquid according to claim 1, wherein, in a case where a pH of the polishing liquid is denoted by X, and a zeta potential of the colloidal silica measured in a state where the colloidal silica is present in the polishing liquid is denoted by Y, a zeta potential in a case where a pH of the polishing liquid is set to X+1, and a zeta potential in a case where a pH of the polishing liquid is set to X−1 are both within a range of Y±5 mV.

5. The polishing liquid according to claim 1, wherein an average primary particle size of the colloidal silica is 15 nm or less.

6. The polishing liquid according to claim 1, wherein the electrical conductivity is 0.05 to 200 μS/cm.

7. The polishing liquid according to claim 1, wherein the colloidal silica has, on a surface thereof, at least one group selected from the group consisting of a sulfonic acid group, a phosphonic acid group, and a carboxylic acid group.

8. The polishing liquid according to claim 1, further comprising:

an acid component, wherein the acid component is at least one compound selected from the group consisting of a compound having an acid group and a basic group, and phosphoric acid.

9. The polishing liquid according to claim 8, wherein the compound having an acid group and a basic group has a cyclic structure.

10. The polishing liquid according to claim 1, further comprising a compound having a heterocyclic ring having two or more nitrogen atoms.

11. The polishing liquid according to claim 1, wherein, in a case where the polishing liquid is used for polishing silicon nitride and silicon oxide, a ratio of a polishing speed for the silicon nitride to a polishing speed for the silicon oxide is 10 or more.

12. The polishing liquid according to claim 1, further comprising a cationic surfactant or an amphoteric surfactant.

13. The polishing liquid according to claim 12, wherein, in a case where the polishing liquid is used for polishing silicon nitride and polysilicon, a ratio of a polishing speed for the silicon nitride to a polishing speed for the polysilicon is 0.25 to 4.

14. The polishing liquid according to claim 1, further comprising an anionic surfactant.

15. The polishing liquid according to claim 14, wherein, in a case where the polishing liquid is used for polishing silicon nitride and polysilicon, a ratio of a polishing speed for the silicon nitride to a polishing speed for the polysilicon is 4 to 100.

16. A chemical mechanical polishing method comprising:

a step of bringing a polishing target surface of a polishing target object into contact with a polishing pad while supplying the polishing liquid according to claim 1 to the polishing pad attached to a polishing platen, relatively moving the polishing target object and the polishing pad to polish the polishing target surface, and obtaining a polished polishing target object.

17. The chemical mechanical polishing method according to claim 16, wherein the polishing target object contains silicon nitride and silicon oxide.

18. The chemical mechanical polishing method according to claim 17, wherein the polishing target object further contains polysilicon.

19. The polishing liquid according to claim 1, further comprising:

a compound having an acid group and a basic group.

20. The polishing liquid according to claim 1, further comprising:

phosphoric acid.

* * * * *